United States Patent [19]
Lin et al.

[11] Patent Number: 5,164,331
[45] Date of Patent: Nov. 17, 1992

[54] METHOD OF FORMING AND ETCHING TITANIUM-TUNGSTEN INTERCONNECTS

[75] Inventors: Jung Lin, Cupertino; Warren M. Uesato, San Jose; Leuh Fang, Santa Clara, all of Calif.

[73] Assignee: Hewlett-Packard Company, Palo Alto, Calif.

[21] Appl. No.: 770,595

[22] Filed: Oct. 3, 1991

[51] Int. Cl.⁵ .................... H01L 21/44; C23F 1/00
[52] U.S. Cl. .................... 437/192; 437/200; 156/664
[58] Field of Search ............ 156/664; 148/DIG. 51; 437/200, 192; 204/192.17

[56] References Cited

U.S. PATENT DOCUMENTS

| | | | |
|---|---|---|---|
| 4,764,245 | 8/1988 | Grewal | 156/664 X |
| 4,889,828 | 12/1989 | Jeuch | 156/664 X |
| 4,927,505 | 5/1990 | Sharma et al. | 204/34.5 |
| 4,957,590 | 9/1990 | Douglas | 156/643 |
| 5,126,007 | 6/1992 | Shmulovich | 156/664 X |

Primary Examiner—John S. Maples

[57] ABSTRACT

A method of forming an interconnect, particularly a local interconnect, for a silicon substrate having integrated circuit devices between dielectric regions. Titanium disilicide is formed on electrode regions of the integrated circuit devices, whereafter titanium-tungsten is deposited across the silicon substrate. A photomask is formed and patterned to cover selected portions of the titanium-tungsten layer. The uncovered portions receive a preliminary etch of chlorine and carbon tetrafluoride to remove oxide. A second etch using trifluoromethane and oxygen removes the uncovered portions, leaving an electrically conductive interconnect extending from an electrode region onto a dielectric region leading to a second electrode region. The photomask is then removed.

20 Claims, 3 Drawing Sheets

METHOD OF FORMING AND ETCHING TITANIUM-TUNGSTEN INTERCONNECTS

DESCRIPTION

1. Technical Field

The present invention relates generally to methods of fabricating an interconnect and more particularly to the choice of material and the method of etching the material for chip level interconnects.

2. Background Art

Fundamental to the fabrication of integrated circuits is the formation of metallization layers to establish electrical communication within the circuit, as well as to external circuitry. A "chip level" interconnect is a metallization layer for electrically connecting device electrodes, e.g. source, drain, gate, base, emitter or collector. A "packaging" interconnect is a metallization layer to provide electrical contact between a chip level interconnect and an input/output lead.

On a large scale, aluminum metallization is typically used as the interconnect layer at both the chip and packaging levels. Aluminum is easily vacuum-deposited and has a high conductivity. Aluminum alloys may also be chosen for different performance-related reasons. Particularly in the area of packaging interconnects, a well-developed technology exists for the deposition and patterning of these metallization layers.

As circuit density increases, the contact area of a device electrode becomes one of the limiting factors for circuit density and performance. A local interconnect is a chip level interconnect that increases circuit density by providing contact between local polysilicon gate and source/drain regions, as well as contact between intra-device source/drain regions, without requiring the formation of contact holes. By eliminating the need for contact holes, the local interconnects reduce parasitic capacitance and enhance circuit performance.

While local interconnects provide improvements in semiconductor integrated circuit chip technology, process complexities and control difficulties have limited the use of local interconnects. U.S. Pat. No. 4,957,590 to Douglas describes alternative methods of forming local interconnects. One described method, credited as a Hewlett-Packard invention, is to use a silicide as the local interconnect material. A layer of titanium is deposited over a substrate and, prior to the direct reaction of the titanium with any underlying silicon and polysilicon to form titanium silicide, a thin layer of amorphous silicon is patterned on top of the titanium metal to define an interconnect extending over a silicon dioxide region separating two electrode regions to be interconnected. The patterned silicon layer forms a silicide across the silicon dioxide region upon reacting of the titanium with the silicon. One difficulty with this method is that it requires deposition and patterning of an additional layer of silicon to define the local interconnections. A second difficulty is that the titanium silicide is a poor diffusion barrier to conventional semiconductor dopants. Thus, where the silicide is used to connect n-type regions to p-type regions, any subsequent processing must be performed at relatively low temperatures to minimize the counterdoping that potentially could take place through the silicide interconnect.

The Douglas patent teaches that titanium nitride is a preferred material for forming local interconnects, but that using standard fluorine-based chemistries in plasma etching the titanium nitride provides unacceptable selectivity for achieving submicron geometries. The Douglas patent notes that carbon tetrafluoride ($CF_4$) etches titanium nitride at twice the rate of titanium silicide, but also etches silicon oxides and photoresists at a rate faster than the titanium nitride. To increase selectivity, Douglas teaches use of a chlorine-bearing agent as a plasma etchant. However, titanium nitride can be difficult to deposit, so that submicron geometries are still difficult to achieve.

Titanium-tungsten is another possible material for fabrication of local interconnects. However, unacceptable etching selectivity and uncontrollable etch rates for etching titanium-tungsten, particularly on titanium disilicide, have prevented the integrated circuit industry from using titanium-tungsten as a material for local interconnects. Wet etching of titanium-tungsten on titanium disilicide ($TiSi_2$) is possible using a mixture of hydrogen peroxide ($H_2O_2$) and sulfuric acid ($H_2SO_4$) or a mixture of $H_2O_2$ and hydrofluoric acid (HF) with water. While the wet etch provides the desired etching selectivity of titanium-tungsten over $TiSi_2$, the wet etch is isotropic by nature and results in an unacceptable undercutting of lines. Plasma etching with $CF_4$ and oxygen gases has been used, but undercutting of line width is not within an acceptable limit. Moreover, with respect to both the wet etch and the plasma etch, process control is difficult.

It is an object of the present invention to provide a method of fabricating interconnects, particularly local interconnects, in which etching is highly selective and reproducible and in which the resulting interconnect has characteristics superior to prior art interconnects.

SUMMARY OF THE INVENTION

The above object has been met by a highly-selective dry etching of titanium-tungsten, a material which provides a low contact resistance to silicide and a low interconnect sheet resistance. A preliminary etch is performed to remove oxide and improve process control, whereafter trifluoromethane and oxygen provide the highly selective etching of titanium-tungsten.

In a self-aligning process, titanium disilicide is formed on electrode regions of transistors fabricated on a silicon substrate. A layer of titanium-tungsten is then sputter deposited on the silicon substrate. A patterned photomask is provided to cover those areas of the titanium-tungsten which will form the interconnect. Typically, the interconnect extends from an electrode region having $TiSi_2$ onto a step of dielectric material, such as a field oxide region. Portions of the titanium-tungsten layer that are left exposed by the photomask are plasma etched using a mixture of trifluoromethane ($CHF_3$) and oxygen ($O_2$) gases. The selectivity of the titanium-tungsten to $TiSi_2$ is 10:1, while the selectivity with respect to oxide is 4:1. The photomask may then be removed.

The preliminary etch prior to the $CHF_3$ and $O_2$ etch is performed after patterning of the photomask. The titanium-tungsten layer has a surface-protective layer, comprising primarily titanium-oxide, that is removed in situ. The surface-protective layer has the potential of slowing down the subsequent etching or of providing irregular etching characteristics along the surface. By removing the titanium oxide in the preliminary etching, a uniform removal of the titanium-tungsten layer is achieved.

An advantage of the present invention is that titanium-tungsten may be used to form local interconnects in silicided circuits. A highly selective etching allows overetching to ensure the desired interconnect configuration without degrading integrated circuit devices. That is, device characteristics such as junction leakage and source/drain series resistance remain approximately the same after formation of the titanium-tungsten interconnect. Another advantage is that key device parameters of interconnect sheet resistance and contact resistance between the interconnect and the silicide are kept well within acceptable limits. The titanium-tungsten local interconnects also allow a reduction of cell area of a CMOS static random access memory cell by approximately 40 percent. The elimination of contact holes on electrode regions of an integrated device reduces junction area and parasitic capacitance.

BEST MODE FOR CARRYING OUT THE INVENTION

Figure 1:
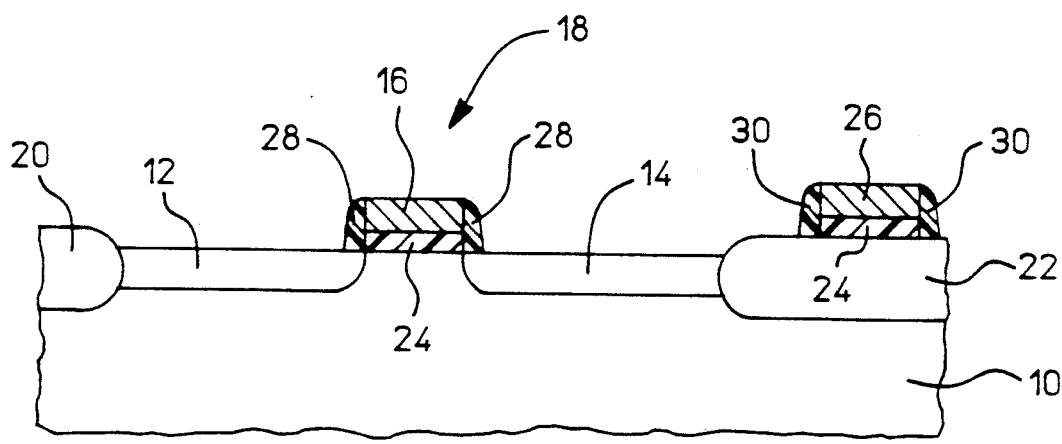
FIGS. 1-4 and FIG. 6 are side sectional views of a fabrication process for forming interconnects in accord with the present invention.
Figure 2:
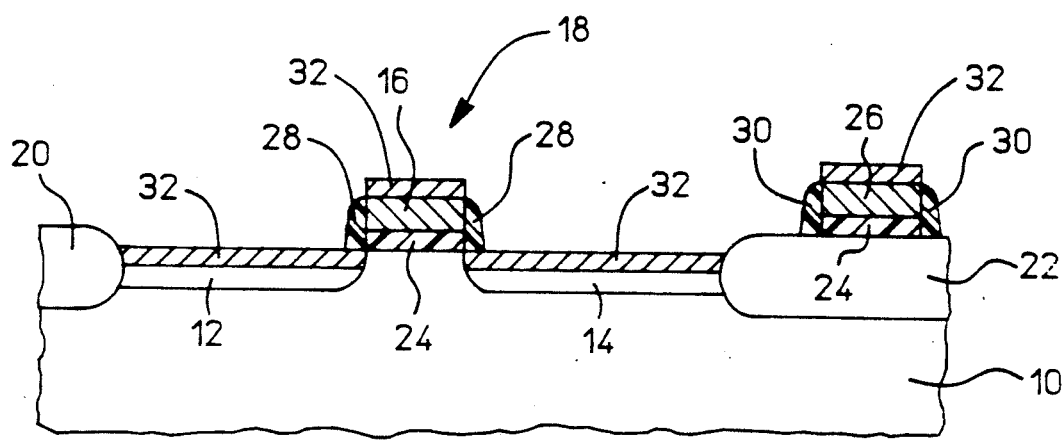

With reference to FIG. 1, a semiconductor substrate 10 is shown as including a source region 12, a drain region 14 and a gate region 16. While the present invention will be described and illustrated as used with CMOS devices, the invention may be employed with other integrated circuit devices, including bipolar devices. "Electrode regions" will be defined as including source, drain, gate, emitter, base and collectors within an integrated circuit.

The source, drain and gate regions 14-16 define a transistor 18. The source and drain regions are diffusion areas of the semiconductor substrate 10. Typically, the substrate is silicon. The transistor 18 is fabricated within an island defined by field oxide regions 20 and 22.

The gate region 16 is disposed atop a patterned gate oxide layer 24. The patterned gate oxide layer 24 includes a partial covering of one of the field oxide regions 22, thereby spacing apart the field oxide region from a polysilicon layer 26. Typically, the polysilicon layer 26 is deposited and patterned simultaneously with the polysilicon gate region 16. The polysilicon layer 26 is contiguous with a gate region of a second transistor. Because the field oxide region 22 is a dielectric material, the portion of the gate oxide layer 24 below the polysilicon layer 26 is not critical.

Oxide sidewall spacers 28 and 30 on the opposed sides of the gate region 16 and the polysilicon layer 26 protect the sidewalls of the polysilicon members 16 and 26 against "bridging" during a self-aligning silicide process. A refractory metal is blanket deposited across the substrate of FIG. 1. Titanium is a preferred metal, since titanium exhibits the lowest resistivity of the refractory metal silicides and since it is able to reliably form a silicide on both polysilicon and single-crystal silicon by thermal reaction. However, other refractory metals may be used. The blanket layer is then treated to react the refractory metal with underlying silicon and polysilicon material. Any of a number of methods may be utilized. In rapid thermal processing (RTP) titanium disilicide is formed at a temperature within the range of 600° C. to 950° C. No reaction takes place at the oxide sidewall spacers 28 and 30 or at the field oxide regions 20 and 22. Unreacted titanium and titanium nitride are then removed, leaving titanium disilicide 32 at the source region 12, the drain region 14, the gate region 16 and the polysilicon layer 26. The self-aligned titanium disilicide ($TiSi_2$) 32 process reduces the gate and source/drain sheet resistance to less than three ohms/square.

Figure 3:
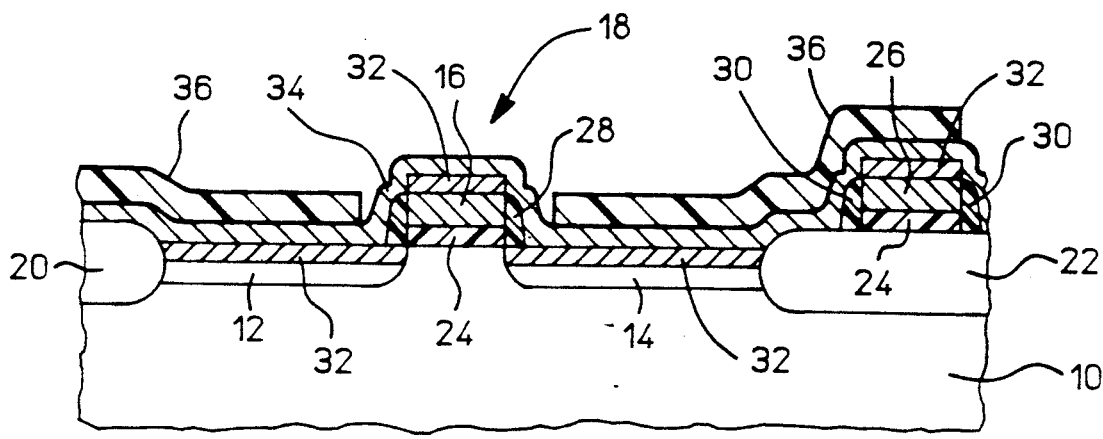

Preferably, the surface of the semiconductor substrate 10 is then cleaned to ensure a low resistance contact with a subsequent deposit of titanium-tungsten 34, shown in FIG. 3. The titanium-tungsten layer 34 is sputter deposited using techniques well known in the art. A preferred thickness for the forming of a local interconnect is 100 nm. Typically, the layer 34 is approximately 20 atomic % titanium and 80 atomic % tungsten. In a manner well known in the art, a layer 36 of photoresist is deposited and patterned to coat only regions of the titanium-tungsten that are to form local interconnects.

In the past, etching of titanium-tungsten on $TiSi_2$ was by a wet dip in a mixture of $H_2O_2$ and $H_2SO_4$, or a mixture of $H_2O_2$ and HF with $H_2O$, or by plasma etching with $CF_4$ and $O_2$ gases. However, these methods suffer from process problems, including undercuts of line width using either plasma etch or wet solution. In addition, the manufacturing process is not easily controlled.

In the present invention, $CHF_3$ and $O_2$ gases are used, enhancing selectivity to the extent that titanium-tungsten may now be utilized in the formation of local interconnects. However, the first step is to remove oxide on the titanium-tungsten layer 34 in order to improve control of the etching characteristics. Titanium oxide is removed by the use of $Cl_2$ and $CF_4$ gases. Carbon tetrafluoride ($CF_4$) is introduced at a flow rate of approximately 40 SCCM, while $Cl_2$ is introduced at approximately 10 SCCM. A pressure of 35 mtorr and a bias of −260 volts is applied for an etching time of two minutes. It has been discovered that without removing the oxide from the titanium-tungsten layer, the gas combination of $CHF_3$ and $O_2$ will not controllably etch away the oxide and pattern the titanium-tungsten. That is, the titanium oxide acts as a protective layer.

Removing the titanium oxide is a first main issue in the process development. The second main issue is achieving a high etching selectivity of the titanium-tungsten layer 34 over the silicide 32. High selectivity has been achieved with the use of the $CHF_3$ and $O_2$ gases. However, any residue of the $Cl_2$ gas must first be removed from the process chamber. One choice of process chambers is Applied Materials' metal etcher model No. 8130. However, other chambers may be employed. $Cl_2$ gas must be removed since even a small amount can react with the $TiSi_2$ to form titanium chlorides which are highly volatile. Residue can be removed by flushing the process chamber with either nitrogen or other process gases, such as one or both of $CHF_3$ or $O_2$ gas. Alternatively, the semiconductor substrate 10 can be transferred from one process chamber to a second process chamber in order to avoid cross contamination.

After removal of the titanium oxide, the titanium-tungsten layer 34 is plasma etched. A conventional photoresist layer 36 is employed. Best results have been achieved by a 40 SCCM flow of $CHF_3$ and a 50 SCCM flow of $O_2$ at an electrode bias of −260 volts and at a pressure of 35 mtorr. The resulting etch rate is approximately 500 angstroms/min. The etch selectivity with respect to the silicide 32 is 10:1, while the selectivity with respect to oxide is approximately 4:1. Because the protective oxide has been removed from the surface of the titanium-tungsten, the etch rate varies significantly with a change in the amount of $O_2$ in the process. A preferred range of flow of $O_2$ is 40-60 SCCM. Preferred ranges of $CHF_3$ flow and process pressure are 35-45 SCCM and 30-40 mtorr, respectively.

Since the titanium-tungsten layer 34 is disposed over the polysilicon gate region 16 and layer 26 in the field oxide topography, significant overetch is required to clear the titanium-tungsten from the oxide sidewall spacers 28. While wet chemical etch can achieve excellent titanium-tungsten etch selectivity, dry etch is preferred to prevent undercutting and to minimize CD loss. Experimentation indicates that a 100% overetch is sufficient to clear a titanium-tungsten from oxide sidewall spacers surrounding the polysilicon and field oxide topography. However, even an overetch of 300% has a negligible effect on the sheet resistance of the silicide 32.

Figure 4:
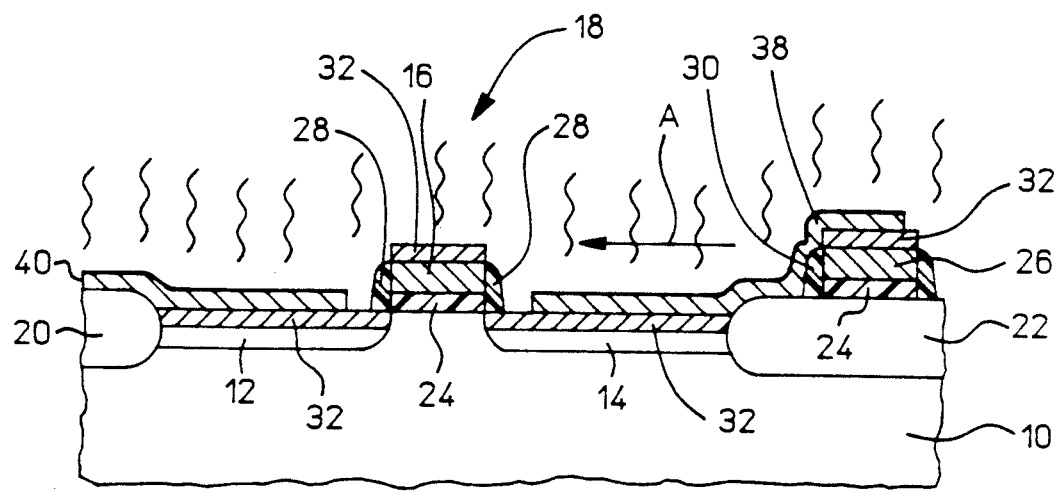

Referring now to FIG. 4, the photoresist is then removed using standard techniques, thereby exposing a pair of local interconnects 38 and 40. The device characteristics of the transistor 18, e.g. threshold voltage and source/drain series resistance, are approximately the same as prior to formation of the titanium-tungsten local interconnects 38 and 40. In general, the results indicate little or no degradation caused by titanium-tungsten dry etch.

The main reason for adopting local interconnect technology is to increase the circuit packing density. The addition of a titanium-tungsten local interconnect allows direct butting contact between a polysilicon gate and doped source/drain regions, thereby greatly reducing the size of an integrated circuit. In one case, the cell area of a CMOS SRAM cell was reduced by approximately 40%. The elimination of contact holes on a source/drain region also reduces the junction area and any parasitic capacitance.

The above-described etching process provides vertical film edges for titanium-tungsten local interconnects 38 and 40. Vertical film edges are required for submicron geometries in the fabrication of semiconductor integrated circuits. The vertical film edges have been attributed to the use of $CHF_3$ gas that produces a polymer layer and has a tendency to protect the interconnect sidewalls during the titanium-tungsten etch process.

As noted above, one reason that titanium-tungsten has not been accepted as a preferred material for formation of local interconnects 38 and 40, is the poor etch selectivity exhibited by prior art etching methods. A second reason is the instability of titanium-tungsten with respect to oxidation. Following formation of the local interconnects 38 and 40, a dielectric material is deposited. Unavoidably, the deposition of the dielectric requires high temperature steps. Employing conventional technology, the result is a formation of oxide at the local interconnect level. A reaction occurring within the titanium-tungsten film causes the constituent materials to combine with oxygen, forming titanium oxide and tungsten oxide. The film then no longer exhibits the same resistivity. In comparison to the prior art, the present method passivates the titanium-tungsten layer to minimize the effects of oxidation. The dangling bonds of the film are tied up by the introduction of nitrogen. Two methods of introducing nitrogen are (1) backsputtering of the film with $N_2$ after deposition of the film and (2) introducing $N_2$ into the ambient during sputter deposition of the film. However, neither of these two methods provides the desired reproducibility of film quality and a desired control of nitrogen concentration.

As shown in FIG. 4, a flow of ammonia ($NH_3$) is directed along Arrow A to present a $NH_3$ ambient for a nitridation of the local interconnects 38 and 40. In a preferred embodiment, the process is a rapid thermal anneal at a temperature of 700° C. for a period of 60 seconds. However, desirable results are achieved within a range of 600° C.-900° C. The 100 nm thick layer of titanium-tungsten of the local interconnects 38 and 40 should be exposed to the $NH_3$ ambient for at least 30 seconds. The preferred flow rate is 5 liters/min.

Figure 5:
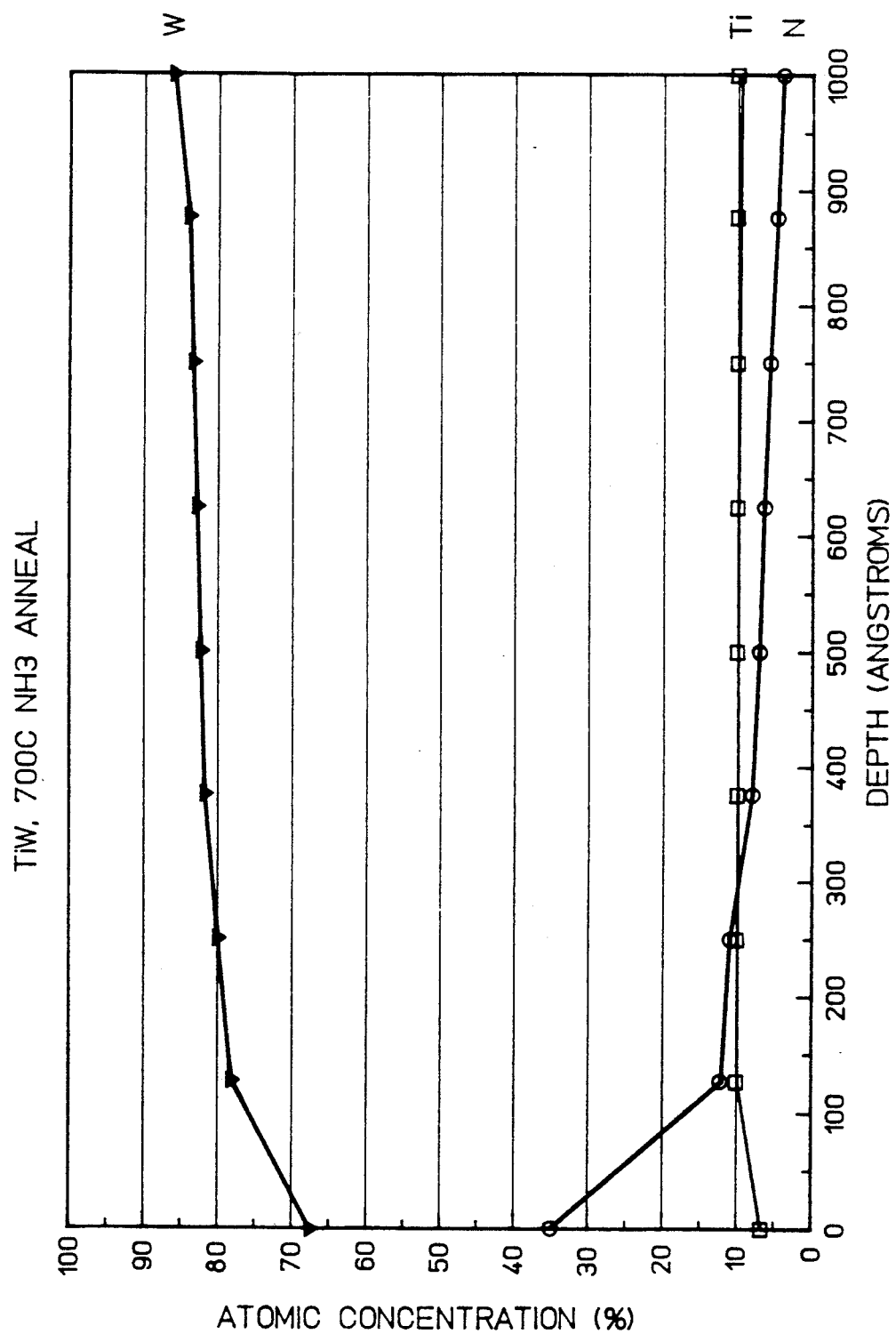
FIG. 5 is a graph of concentrations of constituents of the interconnect of FIG. 6.

An Auger depth profile is shown in FIG. 5 for an anneal at a temperature of 700° C. The surfaces of the titanium-tungsten local interconnects are somewhat nitrogen enriched. Within the bulk of the film, the atomic concentrations of the three constituents of the nitrided titanium-tungsten are relatively constant. It has been demonstrated that the results of FIG. 5 are reproducible without requirement of great attention to process parameters.

Resistivity measurements of identical titanium-tungsten films show a corresponding gradual and monotonic increase in resistivity as the nitrogen content is increased. At the preferred temperature of 700° C., the sheet resistance is approximately ten ohms/square, an increase from approximately six ohms/square achieved by using a rapid thermal anneal temperature of 600° C. At 900° C., the sheet resistance rises to approximately twenty-three ohms/square. All of the above-cited measurements are for titanium-tungsten films having a thickness of 100 nm and are within acceptable limits.

Figure 6:
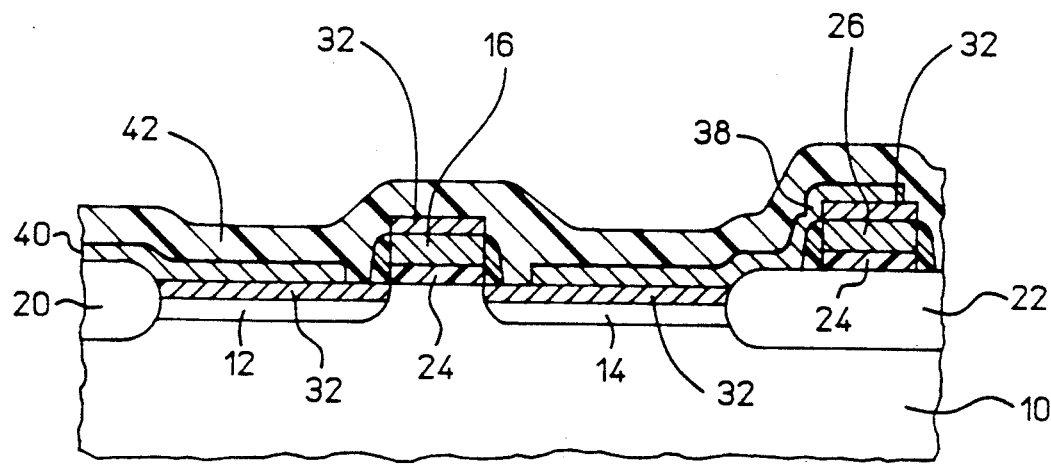

One benefit of the method of titanium-tungsten deposition, patterning and nitridation is that standard sputter deposition equipment, lithography tools and rapid thermal processing chambers may be utilized. More importantly, the etch selectivity provides a vertical profile for the side walls of the local interconnects 38 and 40. Nitridation allows deposition of a dielectric layer 42, shown in FIG. 6, without adverse effects to the resistivity of the local interconnects.

We claim:

1. A method of fabricating an interconnect comprising,
   providing a substrate having integrated circuit devices fabricated thereon,
   forming a layer of titanium-tungsten atop said substrate, and
   patterning said titanium-tungsten layer to form an interconnect of an integrated circuit, including dry etching said titanium-tungsten layer using a gas mixture of trifluoromethane and oxygen.

2. The method of claim 1 wherein said step of patterning said titanium-tungsten includes forming a photoresist layer atop said titanium-tungsten layer in a pattern to define said interconnect.

3. The method of claim 1 further comprising removing oxide from an exposed surface of said titanium-tungsten prior to said step of patterning.

4. The method of claim 3 wherein said step of removing oxide is a step of directing an ambient of chlorine and carbon tetrafluoride gases to said exposed surfaces.

5. The method of claim 1 wherein said step of forming said titanium-tungsten layer includes sputter depositing titanium-tungsten onto electrode regions of said integrated circuit devices.

6. The method of claim 5 further comprising forming a silicide on said active regions prior to said step of forming said titanium-tungsten layer.

7. The method of claim 4 further comprising removing residue of said chlorine gas from the ambient after said step of removing oxide.

8. A method of forming a chip level interconnect comprising,
   providing a semiconductor substrate having integrated circuit devices,
   forming a silicide on electrode regions of said integrated circuit devices,
   depositing titanium-tungsten on said semiconductor substrate,
   forming a mask on selected portions of said titanium-tungsten,
   dry etching portions of said titanium-tungsten uncovered by said mask, including exposing said uncovered portions to $CHF_3$ and $O_2$ gases, thereby leaving a chip level interconnect having a desired configuration, and
   removing said mask.

9. The method of claim 8 wherein said step of forming a silicide includes depositing a layer of titanium and reacting said titanium with said electrode regions.

10. The method of claim 8 wherein said providing a semiconductor substrate includes providing a silicon substrate having dielectric regions and steps from a surface of said silicon substrate to said dielectric regions, said forming said mask including covering titanium-tungsten on a step from said silicon substrate to one of said dielectric regions to form a local interconnect.

11. The method of claim 8 wherein said dry etching is a plasma etching including introducing said $CHF_3$ at a rate in the range of 35 to 45 SCCM.

12. The method of claim 11 wherein said plasma etching includes introducing said $O_2$ at a rate in the range of 40 to 60 SCCM.

13. The method of claim 8 further comprising removing oxide from said uncovered portion of said titanium-tungsten prior to said dry etching, said removing oxide including introducing $Cl_2$ and $CF_4$ gases to said silicon substrate.

14. The method of claim 8 further comprising introducing nitrogen into said titanium-tungsten after said step of removing said mask.

15. A method of forming a local interconnect comprising,
    fabricating transistors between dielectric regions of a silicon substrate, thereby providing steps from electrode regions of said transistors to said dielectric regions,
    forming $TiSi_2$ on said electrode regions,
    sputter depositing titanium-tungsten on said silicon substrate,
    depositing a photomask on said titanium-tungsten,
    patterning said photomask to expose portions of said titanium-tungsten,
    plasma etching said exposed portions of said titanium-tungsten using $CHF_3$ and $O_2$, thereby leaving a local interconnect atop one of said steps and extending from a first electrode region to a second electrode region, and
    removing said photomask.

16. The method of claim 15 wherein said etching includes an overetching of at least 100%.

17. The method of claim 15 wherein said step of sputter depositing is a depositing of a layer 100 nm thick.

18. The method of claim 15 further comprising removing oxide from said exposed portions of said titanium-tungsten using $Cl_2$ and $CF_4$ gases.

19. The method of claim 15 wherein said plasma etching includes introducing said $CHF_3$ at a rate in the range of 35 to 45 SCCM and introducing $O_2$ at a rate in the range of 40 to 60 SCCM.

20. The method of claim 19 wherein said plasma etching is at a pressure in the range of 30 to 40 mtorr.

* * * * *